(12) United States Patent
Ni et al.

(10) Patent No.: US 12,387,926 B2
(45) Date of Patent: Aug. 12, 2025

(54) SELECTIVE FILM FORMATION USING SELF-ASSEMBLED MONOLAYER

(71) Applicant: Tokyo Electron Limited, Tokyo (JP)

(72) Inventors: Zeyuan Ni, Yamanashi (JP); Yumiko Kawano, Yamanashi (JP); Shuji Azumo, Yamanashi (JP); Taiki Kato, Yamanashi (JP); Shinichi Ike, Hwaseong-si (KR)

(73) Assignee: Tokyo Electron Limited, Tokyo (JP)

( * ) Notice: Subject to any disclaimer, the term of this patent is extended or adjusted under 35 U.S.C. 154(b) by 104 days.

(21) Appl. No.: 18/245,550

(22) PCT Filed: Sep. 6, 2021

(86) PCT No.: PCT/JP2021/032609
§ 371 (c)(1),
(2) Date: Mar. 16, 2023

(87) PCT Pub. No.: WO2022/059538
PCT Pub. Date: Mar. 24, 2022

(65) Prior Publication Data
US 2023/0369041 A1 Nov. 16, 2023

(30) Foreign Application Priority Data
Sep. 17, 2020 (JP) ................. 2020-156666

(51) Int. Cl.
*H01L 21/02* (2006.01)
(52) U.S. Cl.
CPC .... *H01L 21/0214* (2013.01); *H01L 21/02164* (2013.01); *H01L 21/02499* (2013.01)

(58) Field of Classification Search
CPC .......... H01L 21/0214; H01L 21/02164; H01L 21/02499
See application file for complete search history.

(56) References Cited

U.S. PATENT DOCUMENTS

| 7,491,286 B2 * | 2/2009 | Kagan | ............... G03F 7/0002 |
| | | | 427/261 |
| 11,882,770 B2 * | 1/2024 | Wojtecki | ............ H10N 60/0912 |

(Continued)

OTHER PUBLICATIONS

Bobb-Semple, Dara, et al., "Area-Selective Atomic Layer Deposition Assisted by Self-Assembled Monolayers: A Comparison of Cu, Co, W, and Ru". Chemistry of Materials, 2019, 31, 1635-1645.*

(Continued)

*Primary Examiner* — Bret P Chen
(74) *Attorney, Agent, or Firm* — Armstrong Teasdale LLP

(57) ABSTRACT

A film formation method includes (A) to (C) below: (A) preparing a substrate including, on a surface of the substrate, a first region from which an insulating film is exposed and a second region from which a metal film is exposed; (B) forming a self-assembled monolayer in the second region by supplying an organic compound containing a nitro group, which is a raw material of the self-assembled monolayer, in a head group to the surface of the substrate, and selectively adsorbing the organic compound to the second region among the first region and the second region; and (C) forming a second insulating film in the first region by supplying a raw material gas as a raw material of the second insulating film to the surface of the substrate while formation of the second insulating film in the second region is inhibited by the self-assembled monolayer.

15 Claims, 16 Drawing Sheets

(56) References Cited

U.S. PATENT DOCUMENTS

| | | | |
|---|---|---|---|
| 2006/0003438 A1* | 1/2006 | Engstrom | H01L 21/02205 435/287.2 |
| 2006/0213425 A1 | 9/2006 | Myerson et al. | |
| 2009/0277389 A1* | 11/2009 | Kakimoto | C23C 16/4404 118/725 |
| 2010/0021851 A1 | 1/2010 | Myerson et al. | |
| 2011/0284386 A1* | 11/2011 | Willey | H01L 21/76898 205/291 |
| 2015/0083988 A1* | 3/2015 | Tanaka | H10K 30/671 257/4 |
| 2016/0284868 A1* | 9/2016 | Terai | H01L 21/02282 |
| 2017/0037513 A1* | 2/2017 | Haukka | C23C 16/04 |
| 2018/0033727 A1* | 2/2018 | Lee | H01L 21/76849 |
| 2018/0233350 A1* | 8/2018 | Tois | H01L 21/321 |
| 2019/0122982 A1* | 4/2019 | Hourani | H01L 23/5226 |
| 2019/0148144 A1* | 5/2019 | Liu | C23C 16/00 257/632 |
| 2019/0322812 A1 | 10/2019 | Wojtecki et al. | |
| 2020/0122191 A1* | 4/2020 | Haukka | C23C 18/1245 |
| 2020/0325573 A1* | 10/2020 | Illiberi | C23C 16/04 |

OTHER PUBLICATIONS

Wolf, Steven, et al., "The role of oxide formation on insulating versus metallic substrates during Co and Ru selective ALD". Applied Surface Science, 510 (2020) 144804, pp. 1-9.*

Hashemi, Fatemeh Sadat Minaye, et al., "A New Resist for Area Selective Atomic and Molecular Layer Deposition on Metal-Dielectric Patterns". The Journal of Physical Chemistry C, 2014, 118, 10957-10962.*

Yue, Youfeng, et al., "Selective Deposition of Insulating Metal Oxide in Perovskite Solar Cells with Enhanced Device Performance". ChemSusChem, 2015, 8, 2625-2629.*

Zhao, Jixiao, et al., "Tuning the selectivity of Pt-catalyzed tandem hydrogenation of nitro compounds via controllable NiO decoration by atomic layer deposition". Catalysis Communications, 121 (2019) 48-52.*

Bellamy, F.D., et al., Selective Reduction of Aromatic Nitro Compounds with Stannous Chloride in Non acidic and Non aqueous medium, Tetrahedron Letters, vol. 25, No. 8, 1984, pp. 839-842.*

Yarbrough, Josiah, et al., "Area-Selective Deposition by Cyclic Adsorption and Removal of 1-Nitropropane". J. Phys. Chem. A 2023, 127, 7858-786.*

* cited by examiner

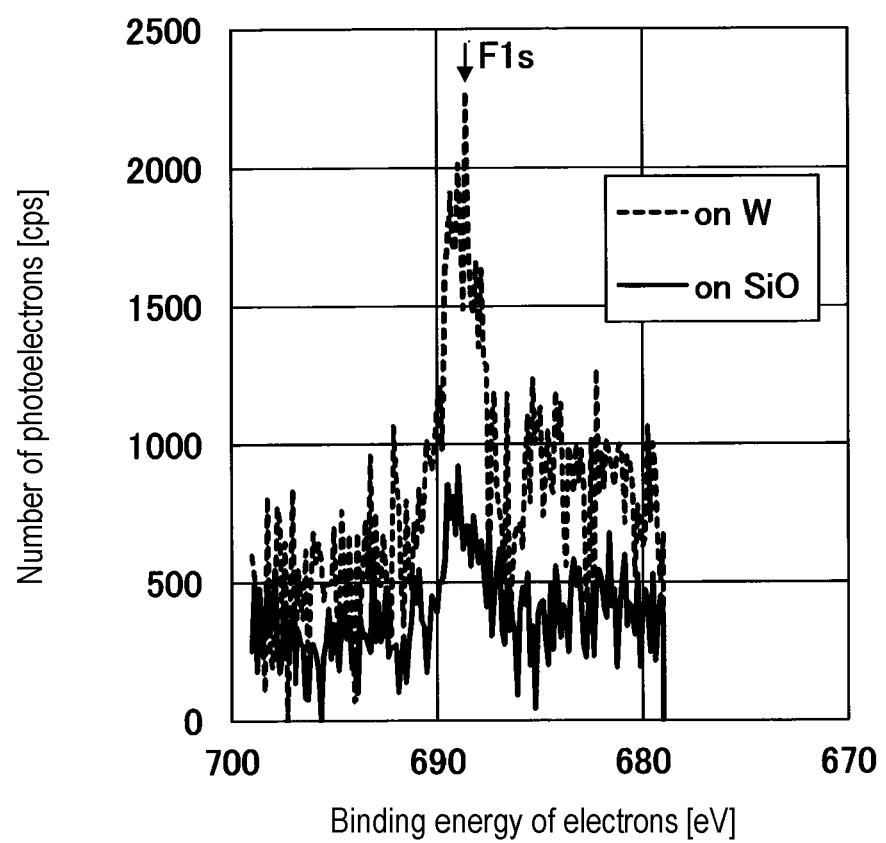

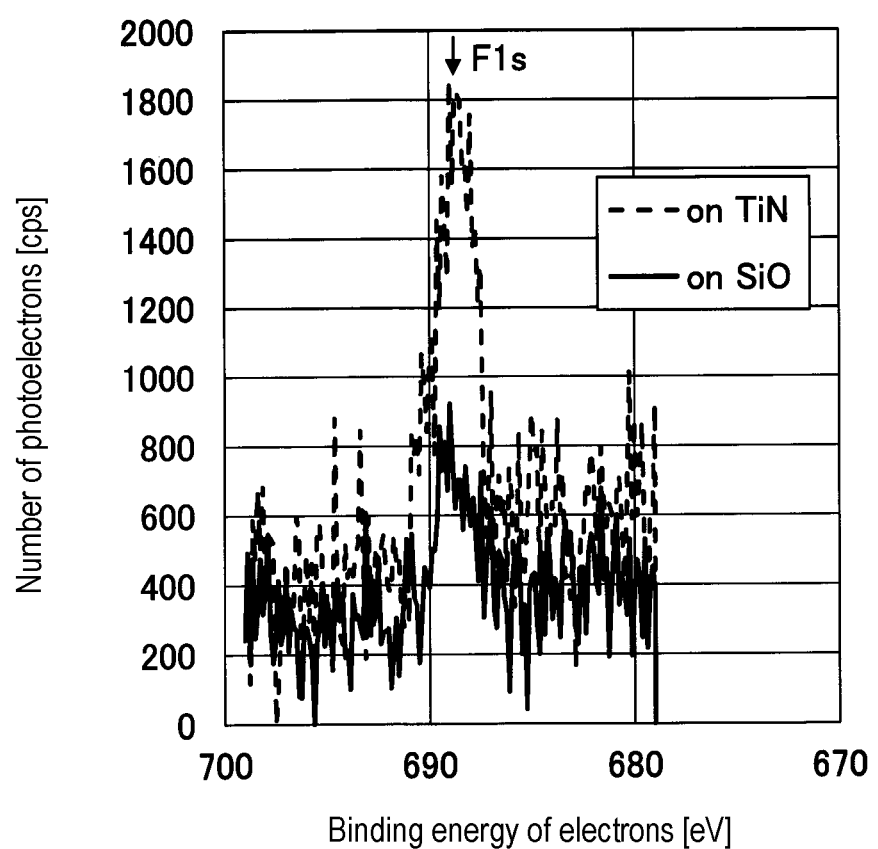

SELECTIVE FILM FORMATION USING SELF-ASSEMBLED MONOLAYER

CROSS-REFERENCE TO RELATED APPLICATIONS

The present application is a U.S. National Stage Entry of International Patent Application No. PCT/JP2021/032609, filed Sep. 6, 2021, which claims the benefit of priority to Japanese Patent Application No. 2020-156666, filed Sep. 17, 2020, each of which is hereby incorporated herein by reference in its entirety.

TECHNICAL FIELD

The present disclosure relates to a film formation method and a film formation device.

BACKGROUND

Patent Document 1 discloses forming a self-assembled monolayer (SAM) on a metal island, and using a nitro group as an example of a head group of an organic compound as a raw material of the SAM. Similar contents are also disclosed in Patent Documents 2 and 3.

PRIOR ART DOCUMENTS

Patent Documents

Patent Document 1: U.S. Patent Application Publication No. 2006/0213425
Patent Document 2: U.S. Patent Application Publication No. 2019/0322812
Patent Document 3: U.S. Patent Application Publication No. 2010/0021851

An aspect of the present disclosure provides a technique for selectively forming an SAM on a metal film among the metal film and an insulating film.

SUMMARY

A film formation method according to an aspect of the present disclosure includes (A) to (C) below: (A) preparing a substrate including, on a surface of the substrate, a first region from which an insulating film is exposed and a second region from which a metal film is exposed; (B) forming a self-assembled monolayer in the second region by supplying an organic compound containing a nitro group, which is a raw material of the self-assembled monolayer, in a head group to the surface of the substrate, and selectively adsorbing the organic compound to the second region among the first region and the second region; and (C) forming a second insulating film in the first region by supplying a raw material gas as a raw material of the second insulating film to the surface of the substrate while formation of the second insulating film in the second region is inhibited by the self-assembled monolayer.

According to an aspect of the present disclosure, it is possible to selectively form an SAM on a metal film among the metal film and an insulating film.

BRIEF DESCRIPTION OF DRAWINGS

FIG. 14 is a diagram comparing and showing a result of a W film and the result of the SiO film, which are illustrated in FIG. 10.
FIG. 15 is a diagram comparing and showing a result of a TiN film and the result of the SiO film, which are illustrated in FIG. 10.

DETAILED DESCRIPTION

Figure 1:
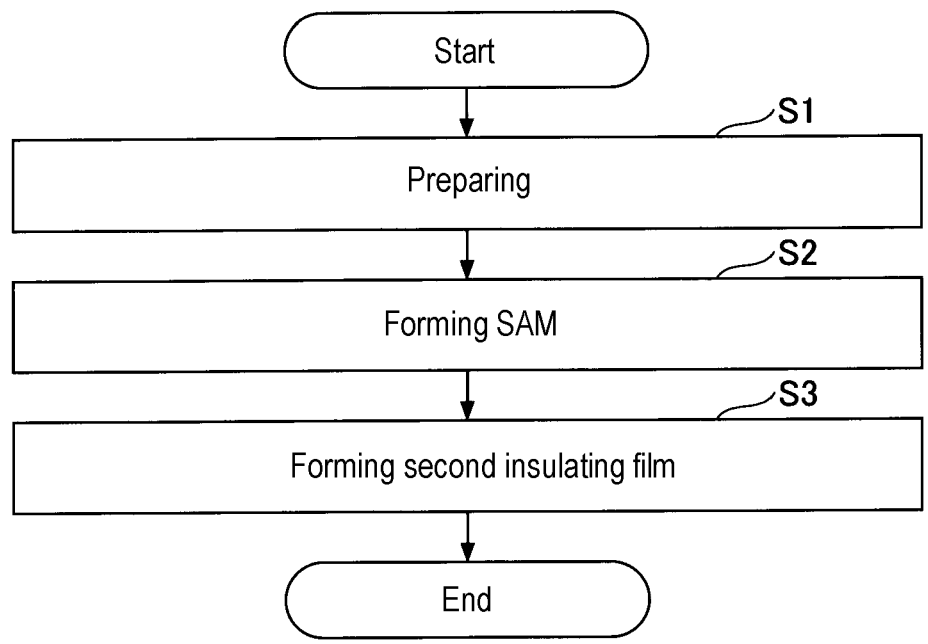
FIG. 1 is a flowchart illustrating a film formation method according to an embodiment.

Hereinafter, embodiments of the present disclosure will be described with reference to the drawings. In each drawing, the same or corresponding components may be denoted by the same reference numerals, and a description thereof may be omitted.

First, a film formation method according to the present embodiment will be described with reference to FIG. 1 and FIGS. 2A to 2C. The film formation method includes, for example, steps S1 to S3 illustrated in FIG. 1. The film formation method may include steps other than steps S1 to S3. In addition, the film formation method may include repeating steps S2 and S3 multiple times.

Figure 2A:
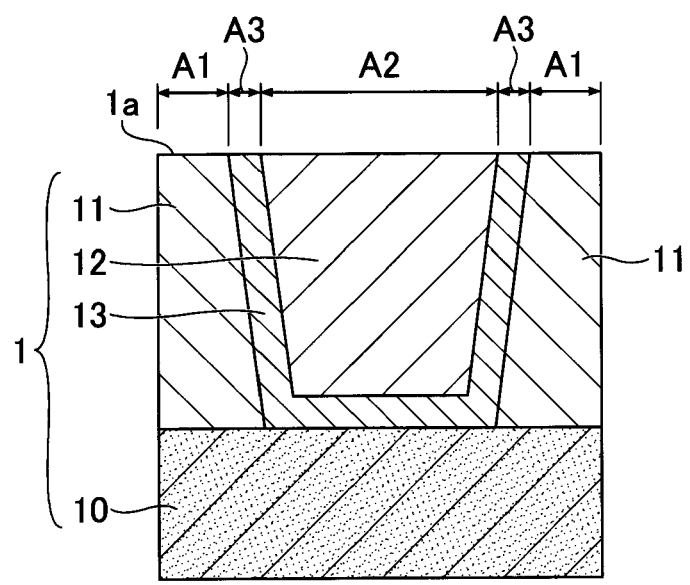
FIG. 2A is a view illustrating a substrate in step S1 according to the embodiment.

First, in step S1 of FIG. 1, a substrate 1 is prepared as illustrated in FIG. 2A. Preparing the substrate 1 includes, for example, loading a carrier C into a film formation device 100 illustrated in FIG. 5. The carrier C accommodates a plurality of substrates 1.

The substrate 1 includes a base substrate 10 such as a silicon wafer or a compound semiconductor wafer. The compound semiconductor wafer is not particularly limited, but is, for example, a GaAs wafer, a SiC wafer, a GaN wafer, or an InP wafer.

The substrate 1 includes an insulating film 11 formed on the base substrate 10. A conductive film or the like may be formed between the insulating film 11 and the base substrate 10. The insulating film 11 is, for example, an interlayer insulating film. The interlayer insulating film is preferably a low dielectric constant (low-k) film.

The insulating film 11 is not particularly limited, but is, for example, a SiO film, a SiN film, a SiOC film, a SiON film, or a SiOCN film. Here, the SiO film means a film containing silicon (Si) and oxygen (O). An atomic ratio of Si and O in the SiO film is not limited to 1:1. The same is also applicable to the SiN film, the SiOC film, the SiON film, and the SiOCN film. The insulating film 11 has a recess on a surface 1a of the substrate 1. The recess is a trench, a contact hole, or via hole.

The substrate 1 has a metal film 12 that fills an interior of the recess. Although the metal film 12 is not particularly limited, but is, for example, a Cu film, a Co film, a Ru film, or a W film.

The substrate 1 further includes a barrier film 13 formed along the recess. The barrier film 13 suppresses metal diffusion from the metal film 12 to the insulating film 11. The barrier film 13 is not particularly limited, but is, for example, a TaN film or a TiN film. Here, the TaN film means a film containing tantalum (Ta) and nitrogen (N). An atomic ratio of Ta and N in the TaN film is not limited to 1:1. The same is also applicable to the TiN film.

Table 1 summarizes specific examples of the insulating film 11, the metal film 12, and the barrier film 13.

TABLE 1

| Insulating film | Metal film | Barrier film |
| --- | --- | --- |
| SiO film | Cu film | TaN film |
| SiN film | Co film | TiN film |
| SiOC film | Ru film | |
| SiON film | W film | |
| SiOCN film | | |

In addition, a combination of the insulating film 11, the metal film 12, and the barrier film 13 is not particularly limited.

As shown in FIG. 2A, the substrate 1 includes, on its surface 1a, a first region A1 from which the insulating film 11 is exposed and a second region A2 from which the metal film 12 is exposed. The substrate 1 may further include, on its surface 1a, a third region A3 from which the barrier film 13 is exposed. The third region A3 is formed between the first region A1 and the second region A2. The structure of the substrate 1 is not limited to the structure illustrated in FIG. 2A, as will be described later.

The substrate 1 may be subjected to a step of removing a natural oxide film before being subjected to step S2 of FIG. 1. The natural oxide film is formed on the surface of the metal film 12. Removing the natural oxide film includes, for example, supplying hydrogen ($H_2$) gas to the surface 1a of the substrate 1. The hydrogen gas reduces and removes the natural oxide film. The hydrogen gas may be heated to a high temperature to promote a chemical reaction. In addition, the hydrogen gas may be plasmarized to promote the chemical reaction.

Removing the natural oxide film is not limited to a dry process on the surface 1a of the substrate 1 but may be a wet process. For example, removing the natural oxide film may be performed by supplying a solution such as citric acid ($C(OH)(CH_2COOH)_2COOH$) to the surface 1a of the substrate 1. Thereafter, the substrate 1 is cleaned with pure water or the like and dried.

Figure 2B:
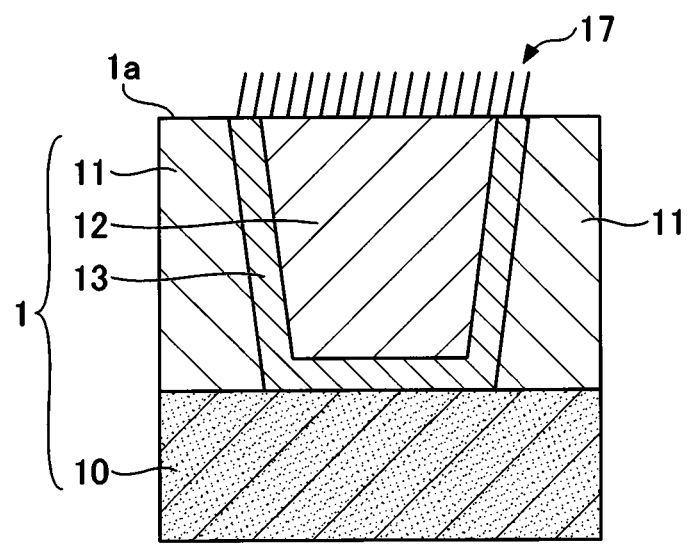
FIG. 2B is a view illustrating the substrate in step S2 according to the embodiment.

Subsequently, in step S2 of FIG. 1, as shown in FIG. 2B, an organic compound containing a nitro group, which is a raw material of an SAM 17, in a head group is supplied to the surface 1a of the substrate 1. The nitro group is more easily chemisorbed to the metal film 12 than to the insulating film 11. Therefore, it is possible to selectively chemisorb the organic component and thus to form the SAM 17 in the second region A2 among the first region A1 and the second region A2.

The nitro group is more easily chemisorbed to the barrier film 13 than to the insulating film 11. Therefore, as illustrated in FIG. 2B, it is possible to selectively chemisorb the organic compound and thus to form the SAM 17 in the second region A2 and the third region A3, among the first region A1, the second region A2, and the third region A3. Thus, the organic compound containing a nitro group in a head group may form the SAM 17 over a plurality of regions (e.g., the second region A2 and the third region A3).

The organic compound containing a nitro group in a head group is represented by a chemical formula "R—$NO_2$." R is, for example, a hydrocarbon group or a hydrocarbon group in which at least a part of hydrogen atoms is substituted with halogen elements. The halogen elements include fluorine, chlorine, bromine, iodine, and the like. A specific example of such an organic compound includes $CF_3(CF_2)_5CH_2CH_2NO_2$.

The above-mentioned organic compound may be supplied to the surface 1a of the substrate 1 in a gaseous state or may be supplied to the surface 1a of the substrate 1 in a liquid state. However, the former may form a denser SAM 17 than the latter. Details will be described later.

Figure 2C:
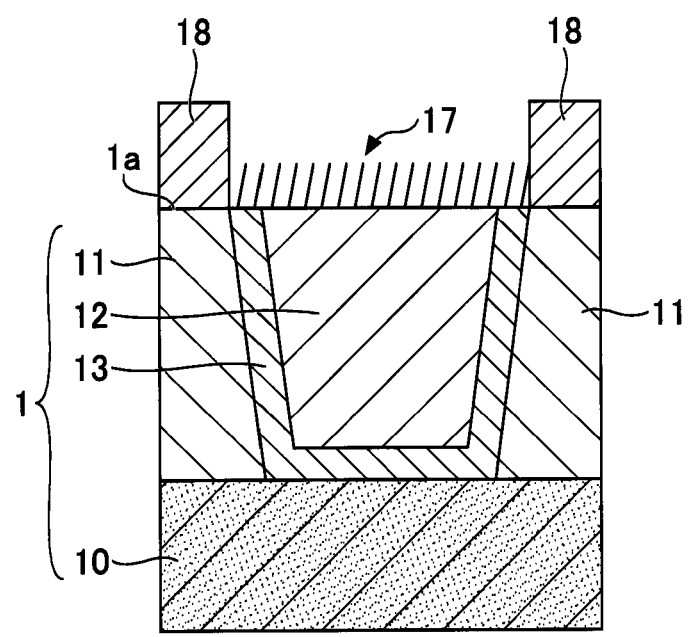
FIG. 2C is a view illustrating the substrate in step S3 according to the embodiment.

Subsequently, in step S3 of FIG. 1, as illustrated in FIG. 2C, a raw material gas as a raw material for a second insulating film 18 is supplied to the surface 1a of the substrate 1 to form the second insulating film 18 in the first region A1 while formation of the second insulating film 18 in the second region A2 is inhibited by the SAM 17. The second insulating film 18 is formed on the insulating film 11, and is not formed on the metal film 12.

As described above, the SAM 17 is formed not only in the second region A2 but also in the third region A3. In this case, in step S3, the second insulating film 18 is formed in the first region A1 while formation of the second insulating film 18 in the second region A2 and the third region A3 is inhibited by the SAM 17. The second insulating film 18 is formed on the insulating film 11, and is not formed on the metal film 12 and the barrier film 13. According to the present embodiment, it is possible to reduce a wiring resistance of the substrate 1 compared to a case where the second insulating film 18 is formed on the barrier film 13.

The second insulating film 18 is formed through a chemical vapor deposition (CVD) method or an atomic layer deposition (ALD) method. The second insulating film 18 is not particularly limited, but is, for example, an AlO film, a SiO film, a SiN film, a ZrO film, a HfO film, or the like. Here, the AlO film means a film containing aluminum (Al) and oxygen (O). An atomic ratio of Al and O in the AlO film is not limited to 1:1. The same is also applicable to the SiO film, the SiN film, the ZrO film, and the HfO film. The second insulating film 18 may be made of the same material as the insulating film 11 or may be made of a different material.

When the AlO film is formed through the ALD method, an Al-containing gas such as trimethylaluminum (TMA) gas and an oxidizing gas such as water vapor ($H_2O$ gas) are alternately supplied to the surface 1a of the substrate 1. Since the water vapor is not adsorbed to the hydrophobic SAM 17, AlO is selectively deposited in the first region A1. A modifying gas such as hydrogen gas may be supplied to the substrate 1 in addition to the Al-containing gas and the oxidizing gas. These raw material gases may be plasmarized to promote a chemical reaction. In addition, these raw material gases may be heated to promote the chemical reaction.

When the HfO film is formed through the ALD method, a Hf-containing gas such as tetrakis(dimethylamide)hafnium (TDMAH: $Hf[N(CH_3)_2]_4$) gas and an oxidizing gas such as water vapor ($H_2O$ gas) are alternately supplied to the surface 1a of the substrate 1. Since the water vapor is not adsorbed to the hydrophobic SAM 17, HfO is selectively deposited in the second region A1. A modifying gas such as hydrogen gas may be supplied to the substrate 1 in addition to the Hf-containing gas and the oxidizing gas. These raw material gases may be plasmarized to promote a chemical reaction. In addition, these raw material gases may be heated to promote the chemical reaction.

Figure 3A:
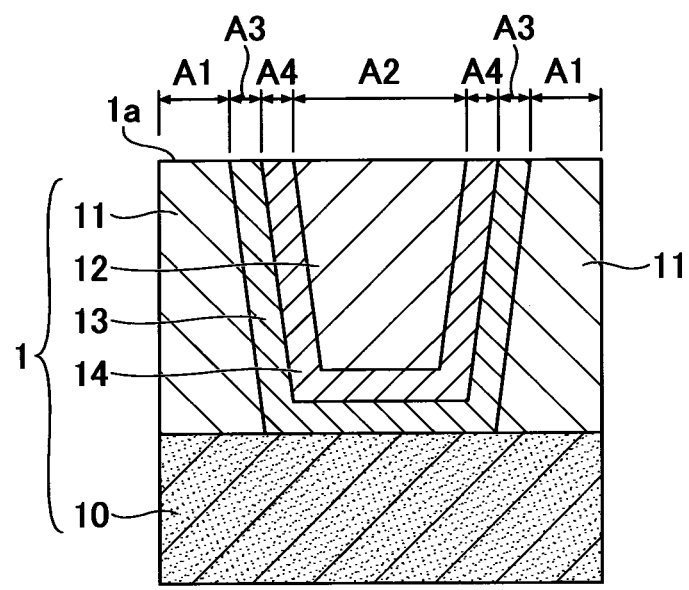
FIG. 3A is a view illustrating a substrate in step S1 according to a first modification.

Next, processing the substrate 1 according to a first modification will be described with reference to FIGS. 3A to 3C. As illustrated in FIG. 3A, the substrate 1 of this modification example further includes, on its surface 1a, a fourth region A4 1a from which a liner film 14 is exposed. The fourth region A4 is formed between the second region A2 and the third region A3. The liner film 14 is formed on the barrier film 13 to assist formation of the metal film 12. The metal film 12 is formed on the liner film 14. The liner film 14 is not particularly limited, but is, for example, a Co film or a Ru film.

Table 2 summarizes specific examples of the insulating film 11, the metal film 12, the barrier film 13, and the liner film 14.

TABLE 2

| Insulating film | Metal film | Barrier film | Liner film |
|---|---|---|---|
| SiO film | Cu film | TaN film | Co film |
| SiN film | | TiN film | Ru film |
| SiOC film | | | |
| SiON film | | | |
| SiOCN film | | | |

In addition, a combination of the insulating film 11, the metal film 12, the barrier film 13, and the liner film 14 is not particularly limited.

However, the nitro group of the organic compound as the raw material of the SAM 17 is more easily chemisorbed to the liner film 14 than to the insulating film 11.

Figure 3B:
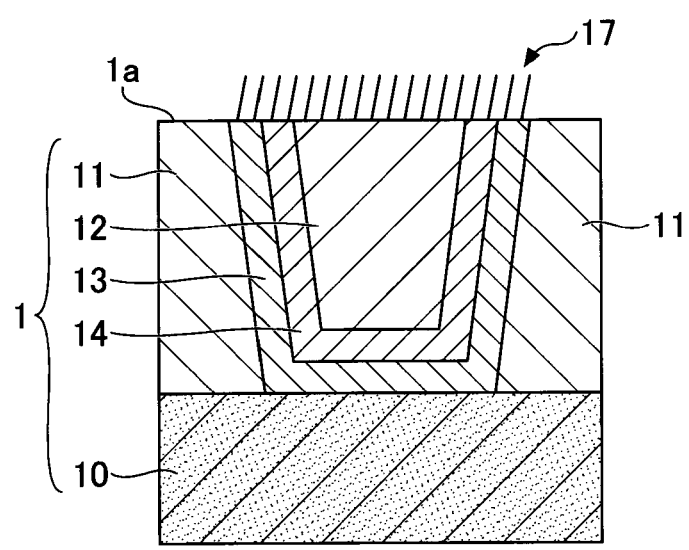
FIG. 3B is a view illustrating the substrate in step S2 according to the first modification.

Therefore, in step S2 of this modification, as illustrated in FIG. 3B, it is possible to selectively chemisorb the organic compound and thus to form the SAM 17 in the second region A2, the third region A3, and the fourth region A4, among the first region A1, the second region A2, the third region A3, and the fourth region A4. The SAM 17 is not formed in the first region A1.

Figure 3C:
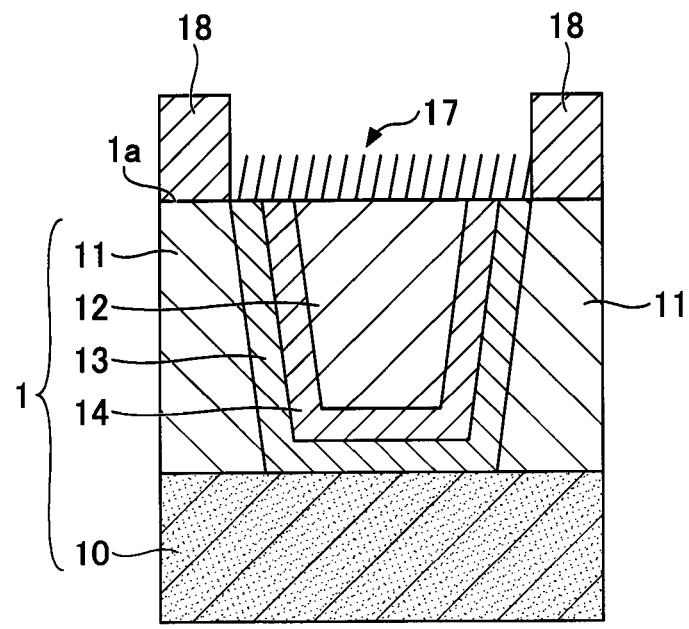
FIG. 3C is a view illustrating the substrate in step S3 according to the first modification.

In step S3 of this modification, as illustrated in FIG. 3C, the second insulating film 18 is formed in the first region A1 while formation of the second insulating film 18 in the second region A2, the third region A3, and the fourth region A4 is inhibited by the SAM 17. The second insulating film 18 is formed on the insulating film 11, and is not formed on the metal film 12, the barrier film 13, and the liner film 14. According to this modification, it is possible to reduce a wiring resistance of the substrate 1 compared to a case where the second insulating film 18 is formed on the barrier film 13 and the liner film 14.

Figure 4A:
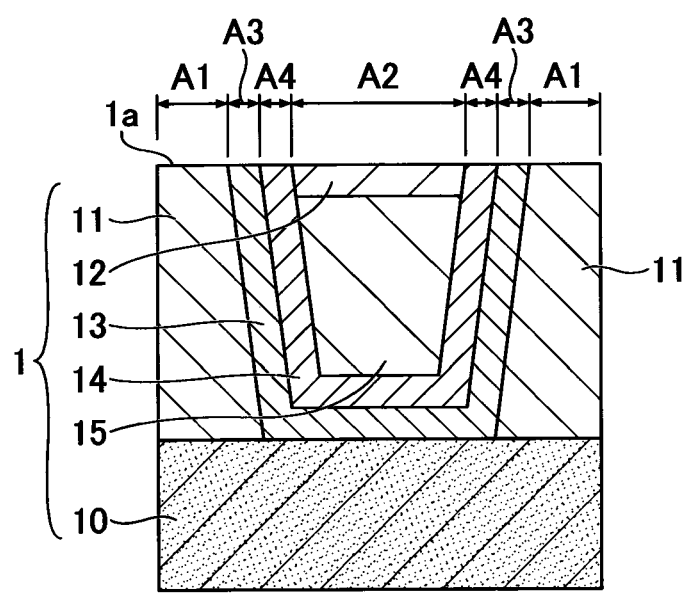
FIG. 4A is a view illustrating a substrate in step S1 according to a second modification.

Next, processing the substrate 1 according to a second modification will be described with reference to FIGS. 4A to 4C. In the substrate 1 of this modification, the metal film 12 is a cap film, as illustrated in FIG. 4A. A second metal film 15 made of a metal different from that of the metal film 12 is embedded in the recess of the insulating film 11. The metal film 12 is formed on the second metal film 15, and the metal film 12 covers the second metal film 15.

Table 3 summarizes specific examples of the insulating film 11, the metal film (cap film) 12, the barrier film 13, the liner film 14, and the second metal film 15.

TABLE 3

| Insulating film | Metal film (Cap film) | Barrier film | Liner film | Second metal film |
|---|---|---|---|---|
| SiO film | Co film | TaN film | Co film | Cu film |
| SiN film | Ru film | TiN film | Ru film | |
| SiOC film | | | | |
| SiON film | | | | |
| SiOCN film | | | | |

In addition, a combination of the insulating film 11, the metal film 12, the barrier film 13, the liner film 14, and the second metal film 15 is not particularly limited.

Figure 4B:
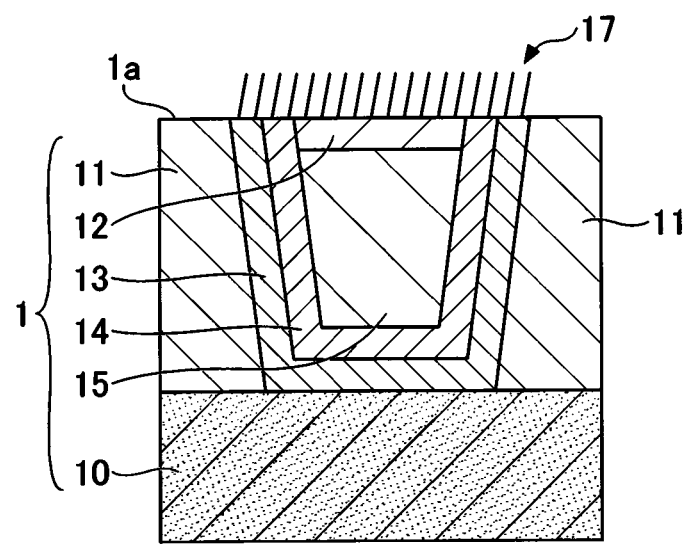
FIG. 4B is a view illustrating the substrate in step S2 according to the second modification.

In step S2 of this modification, as illustrated in FIG. 4B, it is possible to selectively chemisorb the organic compound and thus to form the SAM 17 in the second region A2, the third region A3, and the fourth region A4, among the first region A1, the second region A2, the third region A3, and the fourth region A4. The SAM 17 is not formed in the first region A1.

Figure 4C:
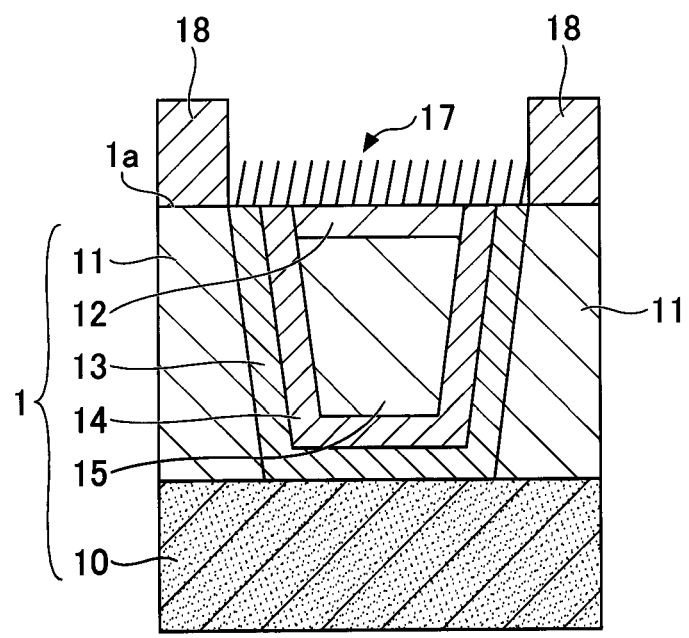
FIG. 4C is a view illustrating the substrate in step S3 according to the second modification.

In step S3 of this modification, as illustrated in FIG. 4C, the second insulating film 18 is formed in the first region A1 while formation of the second insulating film 18 in the second region A2, the third region A3, and the fourth region A4 is inhibited by the SAM 17. The second insulating film 18 is formed on the insulating film 11, and is not formed on the metal film 12, the barrier film 13, and the liner film 14. According to this modification, it is possible to reduce a wiring resistance of the substrate 1 compared to a case where the second insulating film 18 is formed on the barrier film 13 and the liner film 14.

Figure 5:
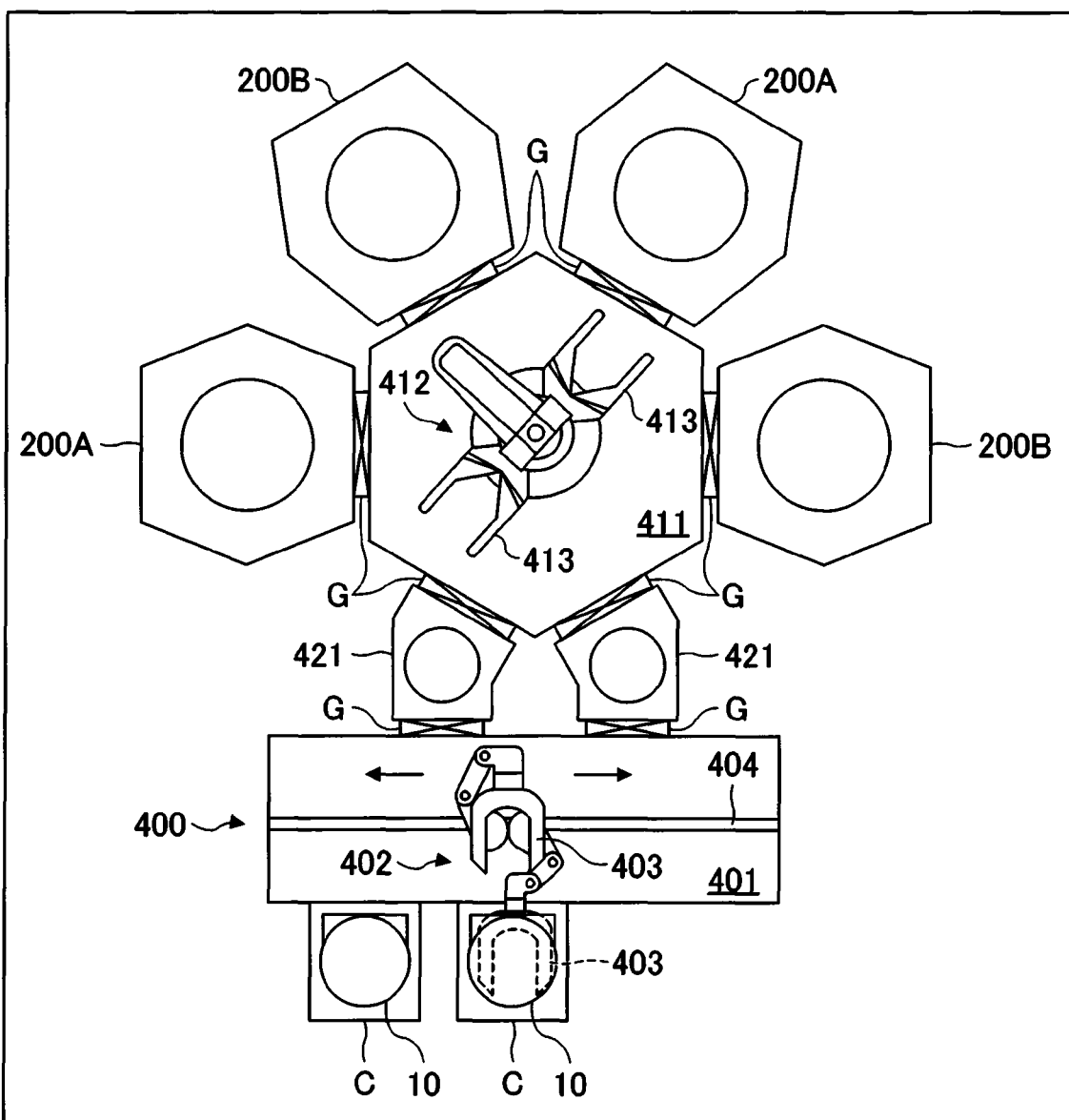
FIG. 5 is a plan view illustrating a film formation device according to an embodiment.

Next, with reference to FIG. 5, the film formation device 100 that executes the above-described film formation method will be described. As illustrated in FIG. 5, the film formation device 100 includes a first processor 200A, a second processor 200B, a transporter 400, and a controller 500. The first processor 200A executes step S2 of FIG. 1. The second processor 200B executes step S3 of FIG. 1. The first processor 200A and the second processor 200B have the same structure. Therefore, it is also possible to execute both steps S2 and S3 in FIG. 1 only by the first processor 200A. The transporter 400 transports the substrate 1 with respect to the first processor 200A and the second processor 200B. The controller 500 controls the first processor 200A, the second processor 200B, and the transporter 400.

The transporter 400 includes a first transport chamber 401 and a first transport mechanism 402. An internal atmosphere of the first transport chamber 401 is atmospheric atmosphere. The first transport mechanism 402 is provided inside the first transport chamber 401. The first transport mechanism 402 includes an arm 403 that holds the substrate 1, and travels along a rail 404. The rail 404 extends in a direction along which carriers C are arranged.

In addition, the transporter 400 includes a second transport chamber 411 and a second transport mechanism 412. The internal atmosphere of the second transport chamber 411 is a vacuum atmosphere. The second transport mechanism 412 is provided inside the second transport chamber 411. The second transport mechanism 412 includes an arm 413 that holds the substrate 1, and the arm 413 is disposed to be movable in the vertical direction and the horizontal direction and to be rotatable around the vertical axis. The first processor 200A and the second processor 200B are connected to the second transport chamber 411 via different gate valves G.

In addition, the transporter 400 includes load-lock chambers 421 between the first transport chamber 401 and the second transport chamber 411. An internal atmospheres of the load-lock chambers 421 are switched between a vacuum atmosphere and atmospheric atmosphere by a pressure regulating mechanism (not illustrated). Thus, an interior of the second transport chamber 411 can always be maintained in a vacuum atmosphere. In addition, it is possible to suppress an inflow of a gas from the first transport chamber 401 to the second transport chamber 411. Gate valves G are provided between the first transport chamber 401 and the load-lock chambers 421, and between the second transport chamber 411 and the load-lock chambers 421.

The controller 500 is, for example, a computer and includes a central processing unit (CPU) 501 and a storage medium 502 such as a memory. The storage medium 502 stores programs for controlling various processes executed in the film formation device 100. The controller 500 controls operations of the film formation device 100 by causing the CPU 501 to execute the programs stored in the storage medium 502. The controller 500 controls the first processor 200A, the second processor 200B, and the transporter 400 to execute the above-described film formation method.

Next, operations of the film formation device 100 will be described. First, the first transport mechanism 402 takes out the substrate 1 from the carrier C, transports the taken-out substrate 1 to the load-lock chamber 421, and withdraws the substrate 1 from the load-lock chamber 421. Subsequently, the internal atmosphere of the load-lock chamber 421 is switched from atmospheric atmosphere to the vacuum atmosphere. Thereafter, the second transport mechanism 412 takes out the substrate 1 from the load-lock chamber 421 and transports the taken-out substrate 1 to the first processor 200A.

Subsequently, the first processor 200A executes step S2. Thereafter, the second transport mechanism 412 takes out the substrate 1 from the first processor 200A and transports the taken-out substrate 1 to the second processor 200B. During this period, since it is possible to maintain a surrounding atmosphere of the substrate 1 to be a vacuum atmosphere, the substrate 1 can be suppressed from being oxidized.

Subsequently, the second processor 200B executes step S3. Thereafter, the second transport mechanism 412 takes out the substrate 1 from the second processor 301, transports the taken-out substrate 1 to the load-lock chamber 421, and withdraws the substrate 1 from the load-lock chamber 421. Subsequently, the internal atmosphere of the load-lock chamber 421 is switched from the vacuum atmosphere to atmospheric atmosphere. Thereafter, the first transport mechanism 402 takes out the substrate 1 from the load-lock chamber 421 and accommodates the taken-out substrate 1 in the carrier C. Then, processing the substrate 1 is completed.

Figure 6:
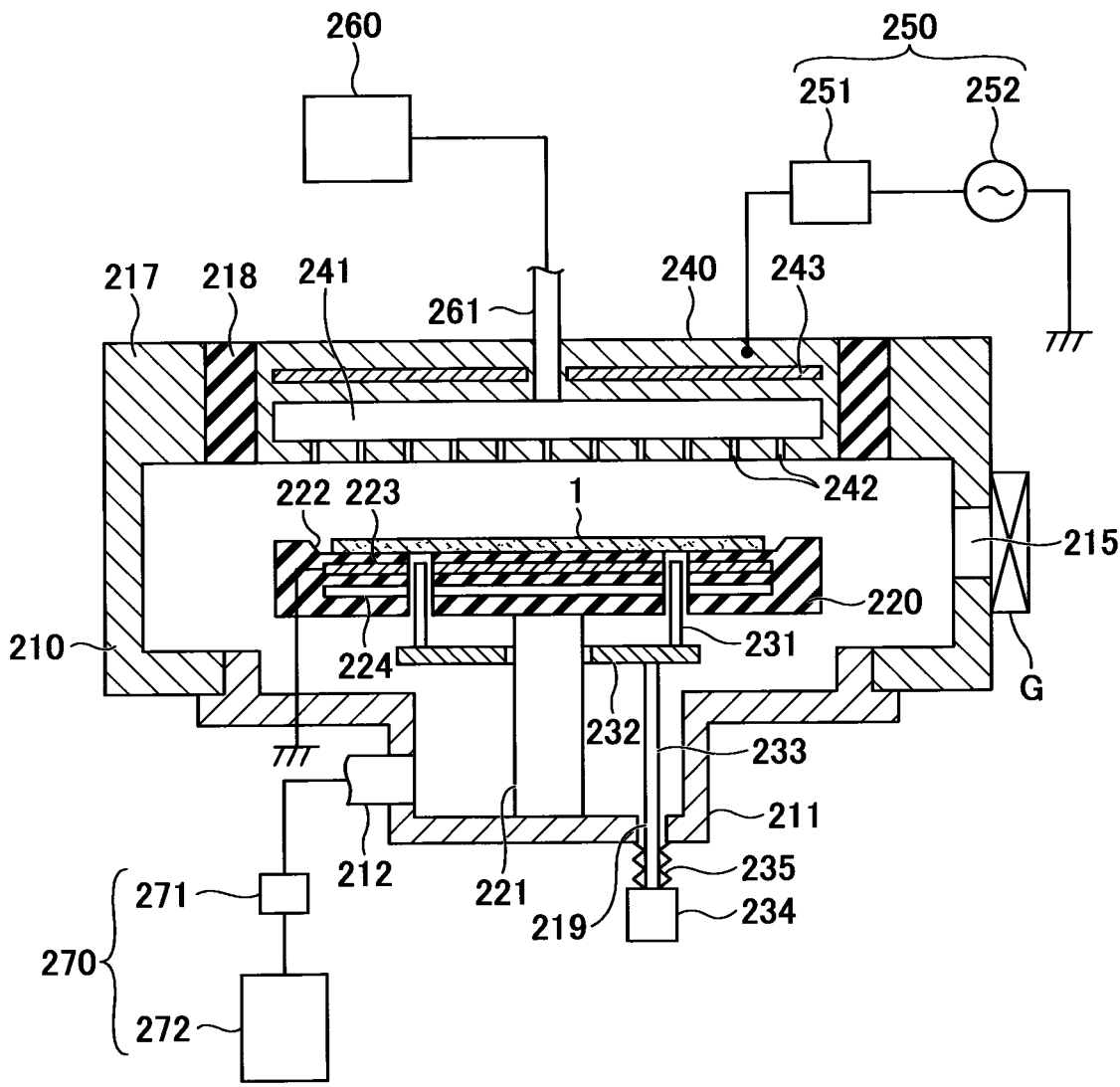
FIG. 6 is a cross-sectional view illustrating an example of a first processor of FIG. 5.

Next, the first processor 200A will be described with reference to FIG. 6. Since the second processor 200B is configured in the same manner as the first processor 200A, illustration and description thereof will be omitted.

The first processor 200A includes a substantially cylindrical and airtight processing container 210. A gas exhaust chamber 211 is provided in a central portion of a bottom wall of the processing container 210. The gas exhaust chamber 211 has, for example, a substantially cylindrical shape that protrudes downward. A gas exhaust pipe 212 is connected to the gas exhaust chamber 211, for example, on a side surface of the gas exhaust chamber 211.

A gas exhaust source 272 is connected to the gas exhaust pipe 212 via a pressure controller 271. The pressure controller 271 includes a pressure regulating valve such as a butterfly valve. The gas exhaust pipe 212 is configured such that a pressure inside the processing container 210 can be reduced by the gas exhaust source 272. The pressure controller 271 and the gas exhaust source 272 constitute a gas discharge mechanism 270 configured to discharge a gas inside the processing container 210.

A transport port 215 is provided in the side surface of the processing container 210. The transport port 215 is opened and closed by a gate valve G. Loading and unloading the substrate 1 between an interior of the processing container 210 and the second transport chamber 411 (see FIG. 5) may be performed via the transport port 215.

A stage 220, which is a holder configured to hold the substrate 1, is provided in the processing container 210. The stage 220 holds the substrate 1 horizontally with the surface 1a of the substrate 1 facing upward. The stage 220 has a substantially circular shape in a plan view and is supported by a support 221. In a surface of the stage 220, a substantially circular recess 222 for placing the substrate 1 having a diameter of, for example, 300 mm is formed. The recess 222 has an inner diameter slightly larger than the diameter of the substrate 1. A depth of the recess 222 is substantially the same as, for example, a thickness of the substrate 1. The stage 220 is made of a ceramic material such as aluminum nitride (AlN). The stage 220 may be made of a metallic material such as nickel (Ni). Instead of the recess 222, a guide ring configured to guide the substrate 1 may be provided on a peripheral edge of the surface of the stage 220.

A lower electrode 223, which is grounded, for example, is embedded in the stage 220. A heating mechanism 224 is embedded below the lower electrode 223. The heating mechanism 224 heats the substrate 1 placed on the stage 220 to a set temperature by receiving power from a power supply (not illustrated) based on a control signal from the controller 500 (see FIG. 5). When the entire stage 220 is made of metal, the entire stage 220 functions as a lower electrode, and thus it is not necessary to embed the lower electrode 223 in the stage 220. The stage 220 is provided with a plurality of (e.g., three) lifting pins 231 configured to hold and lift the substrate 1 placed on the stage 220. A material of the lifting pins 231 may be, for example, ceramic such as alumina ($Al_2O_3$), quartz, or the like. Lower ends of the lifting pins 231 are installed on a support plate 232. The support plate 232 is connected to a lifting mechanism 234 provided outside the processing container 210 via a lifting shaft 233.

The lifting mechanism 234 is installed, for example, below the gas exhaust chamber 211. A bellows 235 is provided between an opening 219 for the lifting shaft 233 formed in a bottom surface of the gas exhaust chamber 211 and the lifting mechanism 234. The support plate 232 may have a shape configured to be raised and lowered without interfering with the support 221 of the stage 220. The lifting pins 231 are configured to be raised and lowered by the lifting mechanism 234 between a position above the surface of the stage 220 and a position below the surface of the stage 220.

A gas supply 240 is provided on a ceiling wall 217 of the processing container 210 via an insulating member 218. The gas supply 240 constitutes an upper electrode and faces the lower electrode 223. A radio-frequency power supply 252 is connected to the gas supply 240 via a matcher 251. By supplying radio-frequency power of 450 kHz to 100 MHz from the radio-frequency power supply 252 to the upper electrode (the gas supply 240), a radio-frequency electric field is generated between the upper electrode (the gas supply 240) and the lower electrode 223 to generate capacitively coupled plasma. A plasma generator 250 configured to generate plasma includes the matcher 251 and the radio-frequency power supply 252. The plasma generator 250 is not limited to generate capacitively coupled plasma, and may generate other plasma such as inductively coupled plasma.

The gas supply 240 includes a hollow gas supply chamber 241. In a bottom surface of the gas supply chamber 241, a plurality of holes 242 configured to disperse and supply a processing gas into the processing container 210 is arranged, for example, evenly. A heating mechanism 243 is embedded in the gas supply 240, for example, above the gas supply chamber 241. The heating mechanism 243 is heated to a set temperature by receiving power from a power supply (not illustrated) based on a control signal from the controller 500.

A gas supply mechanism 260 is connected to the gas supply chamber 241 via a gas path 261. The gas supply mechanism 260 supplies a gas, which is used in at least one of steps S2 and S3 in FIG. 1, to the gas supply chamber 241 via the gas path 261. Although not illustrated, the gas supply mechanism 260 includes an individual pipe for each type of gases, an opening/closing valve provided in a middle of the individual pipe, and a flow controller provided in a middle of the individual pipe. When the opening/closing valve opens the individual pipe, a gas is supplied from a source thereof to the gas path 261. A supply amount of the gas is controlled by the flow controller. On the other hand, when the opening/closing valve closes the individual pipe, the supply of the gas from the source to the gas path 261 is stopped.

Experiment Example 1

In Experiment Example 1, a Cu substrate was prepared, a natural oxide film on a surface of the Cu substrate was removed, a raw material of an SAM was supplied to the surface of the Cu substrate, and the Cu substrate was heated to fix the SAM. Thereafter, the surface state of the Cu substrate was measured with an X-ray photoelectron spectroscopy (XPS) device.

In removing the natural oxide film, the Cu substrate was immersed for one minute in an aqueous solution having a citric acid concentration of 1% by volume and a temperature of 65 degrees C. Thereafter, the Cu substrate was cleaned with pure water, and then dried with $N_2$ gas.

In supplying the raw material of the SAM, the Cu substrate was immersed for thirty minutes in a room-temperature toluene solution having a concentration of the raw material of the SAM of 0.1% by volume. Thereafter, the Cu substrate was washed with toluene at room temperature, and then dried with $N_2$ gas. $CF_3(CF_2)_5CH_2CH_2NO_2$ was used as the raw material of the SAM.

In fixing the SAM, the Cu substrate was heated for ten minutes on a hot plate having a temperature of 60 degrees C., and then heated for four minutes on a hot plate having a temperature of 120 degrees C.

Figure 7:
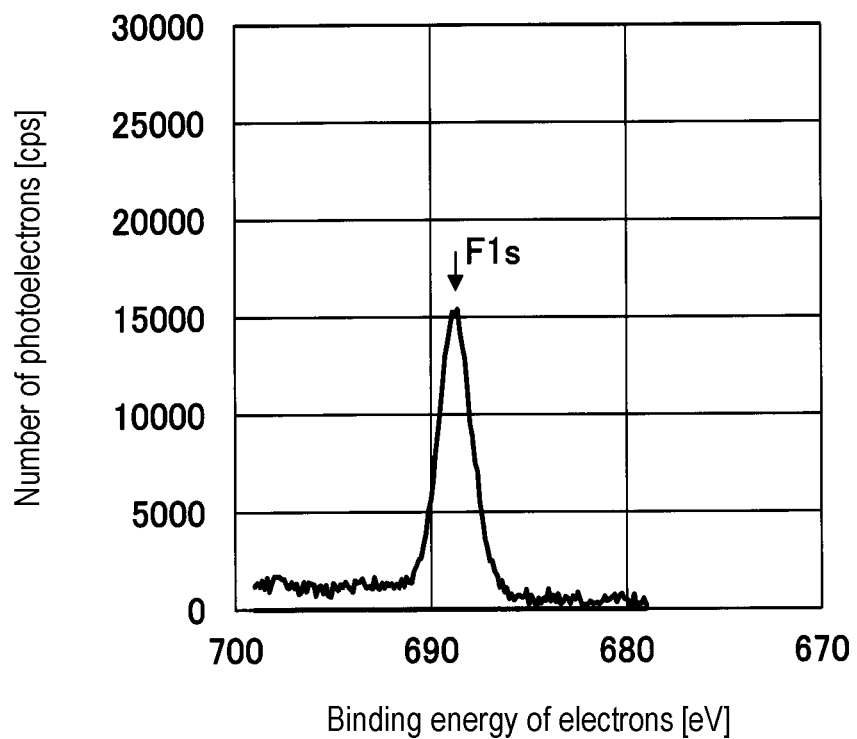
FIG. 7 is a diagram showing a result of XPS measurement of a surface state of a Cu substrate obtained in Experiment Example 1.

FIG. 7 shows a result of XPS measurement of a surface state of the Cu substrate obtained in Experiment Example 1. As shown in FIG. 7, since a peak of fluorine (F), which is a constituent element of the SAM, is recognized, it can be seen that the SAM was formed on the surface of the Cu substrate.

Experiment Example 2

In Experiment Example 2, a Cu substrate was processed under the same conditions as in Experiment Example 1, except that a processing temperature was changed from room temperature to 85 degrees C. when supplying the raw material of the SAM to the surface of the Cu substrate. Specifically, in supplying the raw material of the SAM, the Cu substrate was immersed for five minutes in a toluene solution having a concentration of the raw material of the SAM of 0.1% by volume and a temperature of 85 degrees C. Thereafter, the Cu substrate was washed with toluene at 85 degrees C., and dried with $N_2$ gas.

Figure 8:
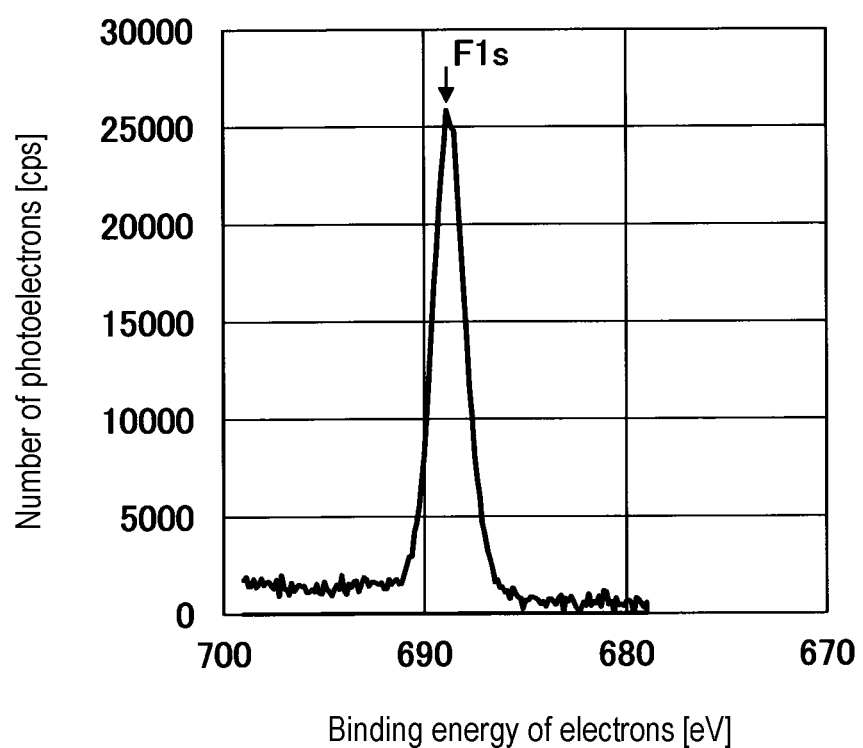
FIG. 8 is a diagram showing a result of XPS measurement of a surface state of a Cu substrate obtained in Experiment Example 2.

FIG. 8 shows a result of XPS measurement of a surface state of the Cu substrate obtained in Experiment Example 2. As shown in FIG. 8, since a peak of fluorine (F), which is a constituent element of the SAM, is recognized, it can be seen that the SAM was formed on the surface of the Cu substrate.

In addition, since the peak of fluorine in FIG. 8 is larger than the peak of fluorine in FIG. 7, it can be seen that, by changing the processing temperature from room temperature to 85 degrees C. when supplying the raw material of the SAM to the surface of the Cu substrate, the SAM is formed on the surface of the Cu substrate at a higher density.

Experiment Example 3

In Experiment Example 3, the Cu substrate was processed under the same conditions as in Experimental Example 2, except that the raw material of the SAM was supplied to the surface of the Cu substrate in a gaseous state instead of being supplied in a liquid state. Specifically, in supplying the raw material of the SAM in Experiment Example 3, first, both a toluene solution having concentration of the raw material of the SAM of 0.1% by volume and a Cu substrate were accommodated in a container, and the Cu substrate was placed above a liquid surface. In that state, the entire container was uniformly heated from outside by a heater. A heating temperature was 85 degrees C., and a heating time was five minutes. Thus, the raw material of the SAM was supplied to the surface of the Cu substrate in a gaseous state.

Figure 9:
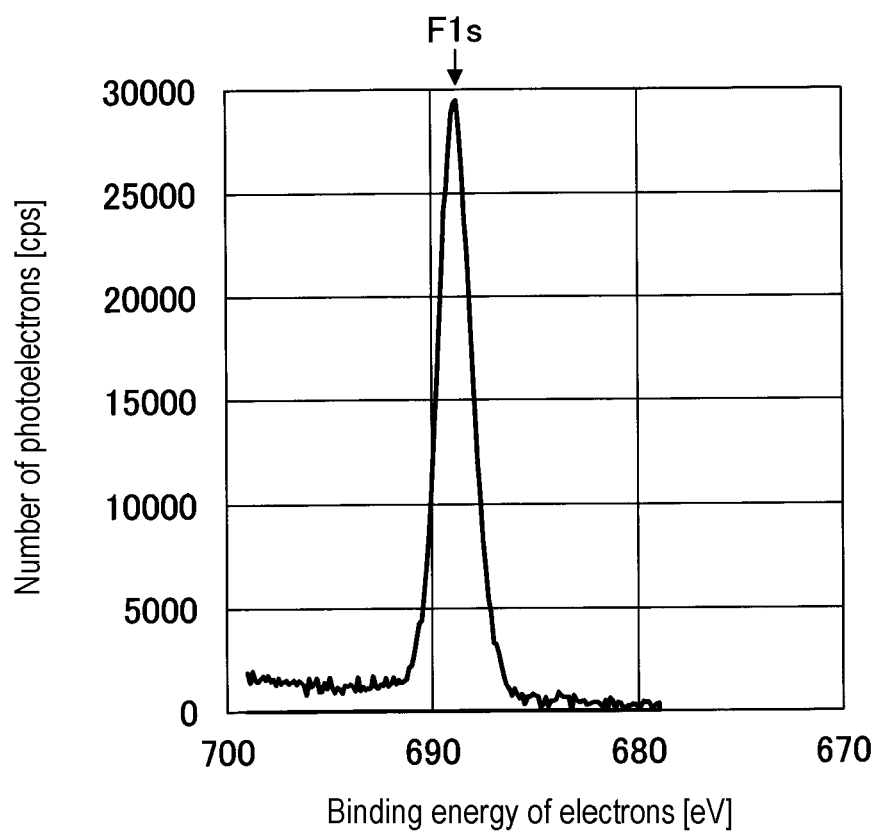
FIG. 9 is a diagram showing a result of XPS measurement of a surface state of a Cu substrate obtained in Experiment Example 3.

FIG. 9 shows a result of XPS measurement of a surface state of the Cu substrate obtained in Experiment Example 3. As shown in FIG. 9, since a peak of fluorine (F), which is a constituent element of the SAM, is recognized, it can be seen that the SAM was formed on the surface of the Cu substrate.

In addition, since the peak of fluorine in FIG. 9 is larger than the peak of fluorine in FIG. 8, it can be seen that by supplying the SAM to the Cu substrate surface in a gaseous state instead of in a liquid state, the SAM is formed on the Cu substrate surface at a higher density.

Experiment Example 4

In Experiment Example 4, except that various substrates were prepared instead of the Cu substrate, the substrates were processed under the same conditions as in Experiment Example 2. As the substrates, a substrate having a Co film on a surface thereof, a substrate having a Ru film on a surface thereof, a substrate having a W film on a surface thereof, a substrate having a TiN film on a surface thereof, and a substrate having a SiO film on a surface thereof were prepared. The SiO film was a silicon thermal oxide film.

In addition, in supplying the raw material of the SAM in Experiment Example 4, the substrates were immersed for five minutes in a toluene solution having a concentration of the raw material of the SAM of 0.1% by volume and a temperature of 85 degrees C., in the same manner as in the supplying of the raw material of the SAM in Experiment Example 2. Thereafter, the substrates were cleaned with toluene at 85 degrees C., and dried with $N_2$ gas.

Figure 10:
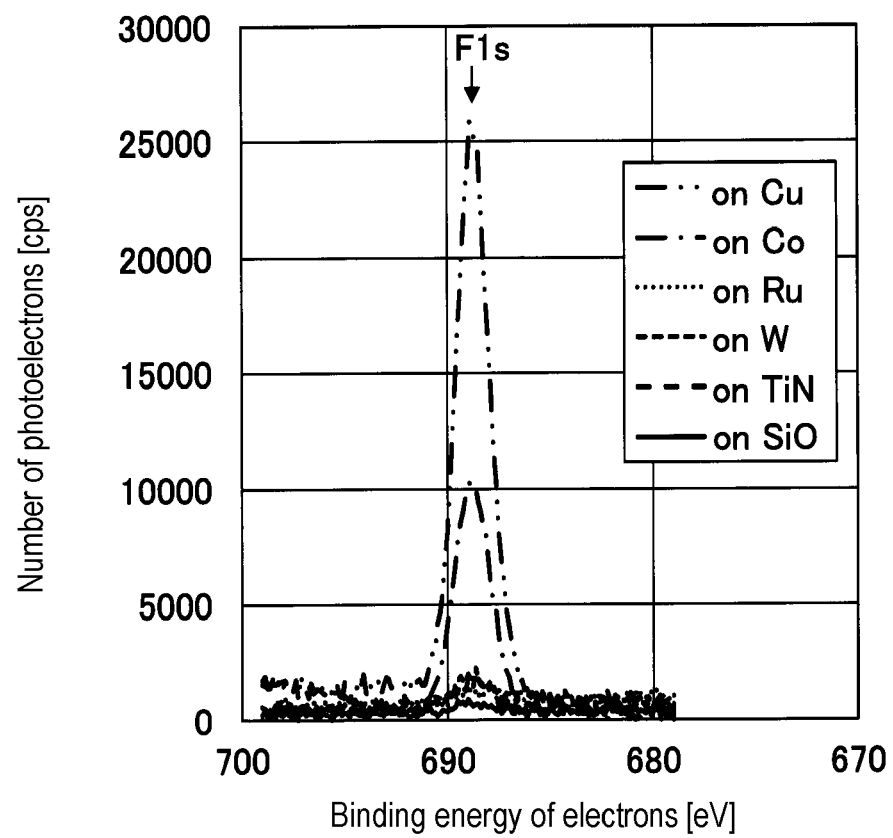
FIG. 10 is a diagram showing results of XPS measurement of surface states of various substrates obtained in Experiment Example 4.
Figure 11:
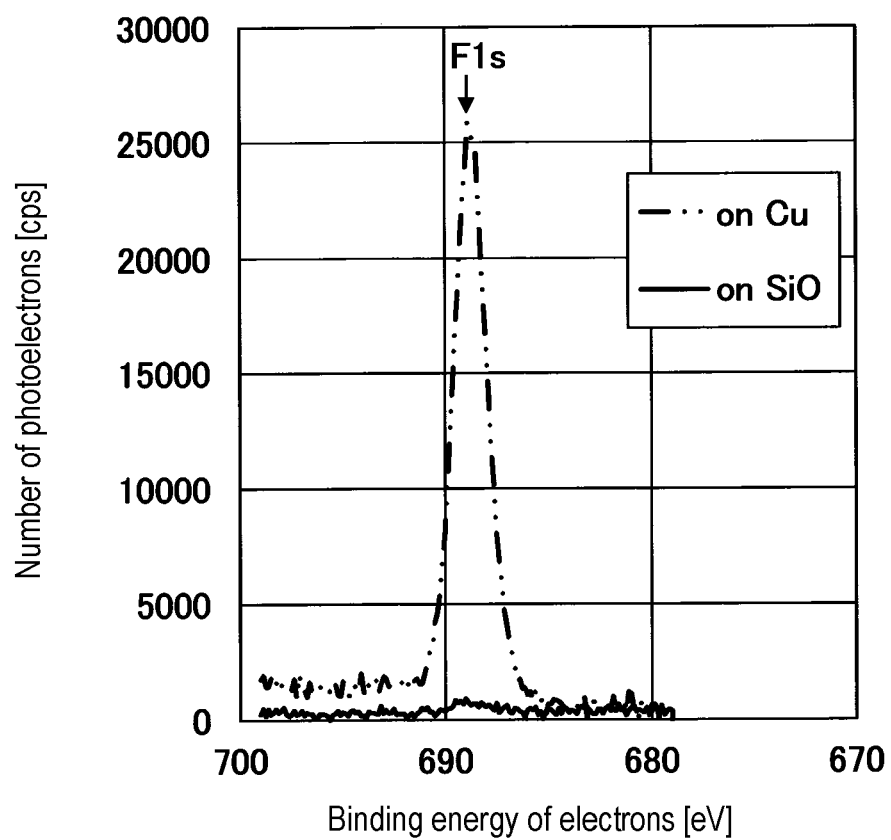
FIG. 11 is a diagram comparing and showing a result of a Cu substrate and a result of a SiO film, which are illustrated in FIG. 10.
Figure 12:
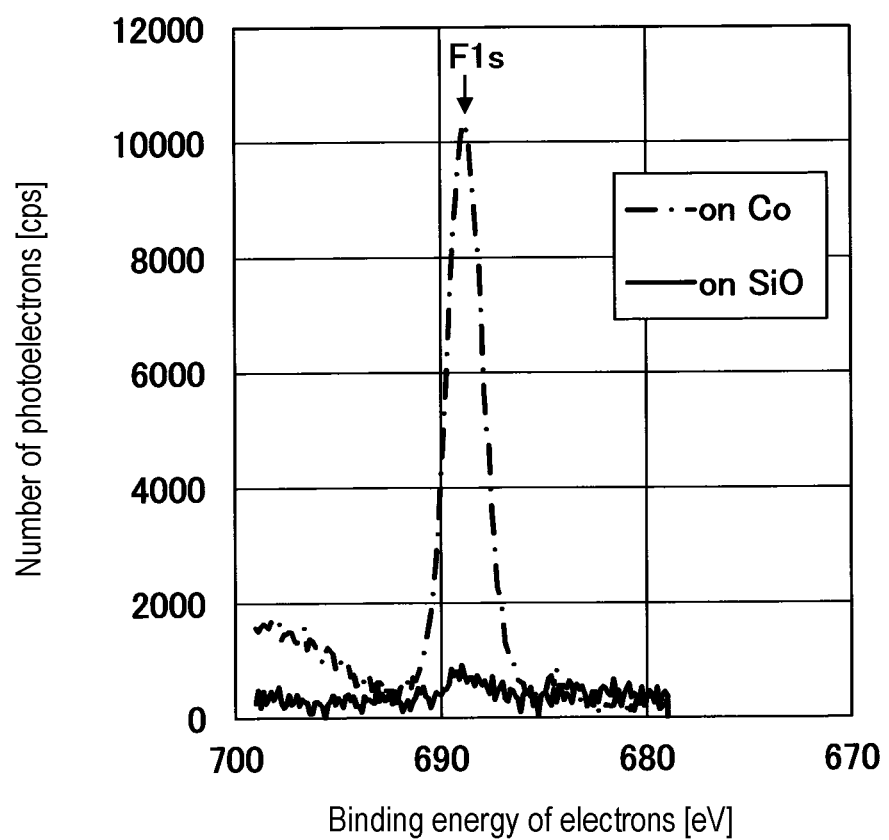
FIG. 12 is a diagram comparing and showing a result of a Co film and the result of the SiO film, which are illustrated in FIG. 10.
Figure 13:
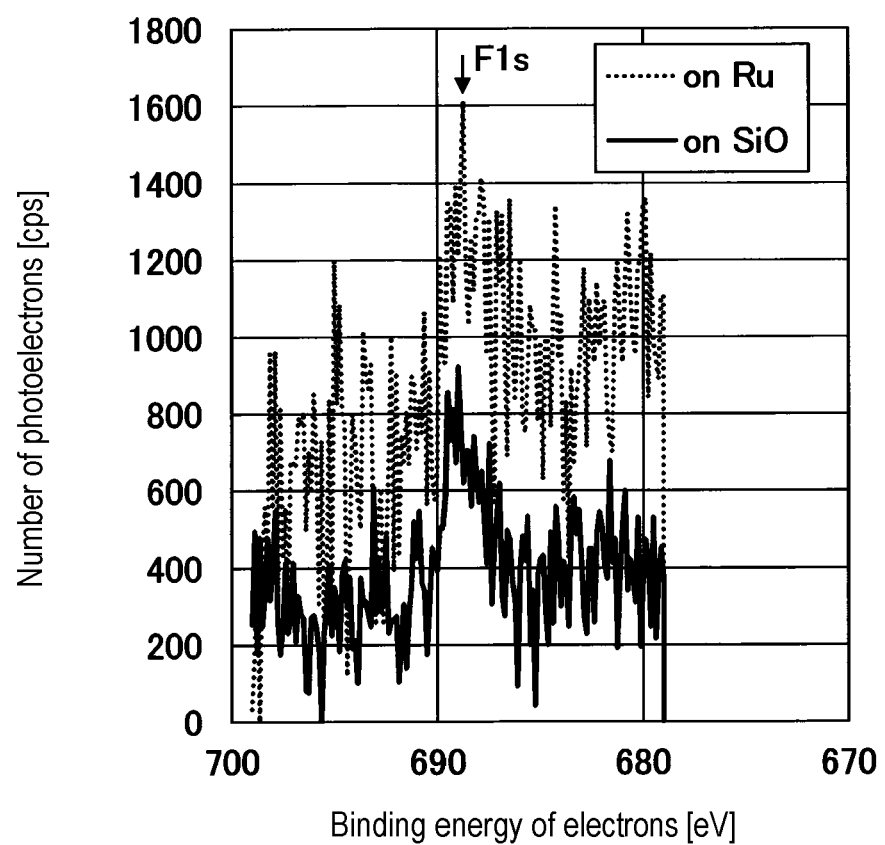
FIG. 13 is a diagram comparing and showing a result of a Ru film and the result of the SiO film, which are illustrated in FIG. 10.

FIG. 10 shows results of XPS measurement of surface states of the various substrates obtained in Experiment Example 4. FIG. 10 also shows the result of XPS measurement of the surface state of the Cu substrate of Experiment Example 2. As is clear from FIGS. 10 to 15, the raw material of the SAM is more easily adsorbed to Cu, Co, Ru, W, and TiN than to SiO.

Therefore, it can be seen that an organic compound containing a nitro group in a head group is capable of forming an SAM not only in a region in which a metal film is exposed but also in a region in which a barrier film is exposed or a region in which a liner film is exposed. In addition, the SAM is capable of inhibiting not only formation of the second insulating film on the metal film, but also formation of the second insulating film on the barrier film or the liner film. Therefore, it is possible to reduce the wiring resistance of the substrate 1.

Although the embodiments of the film formation method and the film formation device according to the present disclosure have been described above, the present disclosure is not limited to the above-described embodiments or the like. Various changes, modifications, substitutions, additions, deletions, and combinations may be made within the scope of the claims. Of course, these also fall within the technical scope of the present disclosure.

This application claims priority based on Japanese Patent Application No. 2020-156666 filed with the Japan Patent Office on Sep. 17, 2020, and the disclosure of Japanese Patent Application No. 2020-156666 is incorporated herein in its entirety by reference.

EXPLANATION OF REFERENCE NUMERALS

1: substrate, 1a: surface, 11: insulating film, 12: metal film, 17: self-assembled monolayer (SAM), 18: second insulating film, A1: first region, A2: second region

What is claimed is:

1. A film formation method comprising:
preparing a substrate in which a first insulating film and a first metal film are formed, wherein a surface of the substrate includes a first region from which the first insulating film is exposed and a second region from which the first metal film is exposed;
forming a self-assembled monolayer on the first metal film in the second region by supplying, as a raw material of the self-assembled monolayer, an organic compound containing a nitro group in a head group to the surface of the substrate, and selectively adsorbing the organic compound to the second region among the first region and the second region; and
forming a second insulating film on the first insulating film in the first region by supplying a raw material gas as a raw material of the second insulating film to the surface of the substrate while formation of the second insulating film in the second region is inhibited by the self-assembled monolayer.

2. The film formation method of claim 1, wherein the first insulating film has a recess in the surface of the substrate, and
wherein the first metal film is formed in the recess.

3. The film formation method of claim 2, wherein the substrate further includes, on the surface of the substrate, a third region from which a barrier film is exposed, and
wherein the film formation method further comprises:
forming the self-assembled monolayer in the second region and the third region by selectively adsorbing the organic compound to the second region and the third region, among the first region, the second region, and the third region; and
forming the second insulating film in the first region while formation of the second insulating film in the second region and the third region is inhibited by the self-assembled monolayer.

4. The film formation method of claim 3, wherein the barrier film is a TaN film or a TiN film.

5. The film formation method of claim 4, wherein the substrate further includes, on the surface of the substrate, a fourth region from which a liner film is exposed, and
wherein the film formation method further comprises:
forming the self-assembled monolayer in the second region, the third region, and the fourth region by selectively adsorbing the organic compound to the second region, the third region, and the fourth region, among the first region, the second region, the third region, and the fourth region; and
forming the second insulating film in the first region while formation of the second insulating film in the second region, the third region, and the fourth region is inhibited by the self-assembled monolayer.

6. The film formation method of claim 5, wherein the liner film is a Co film or a Ru film.

7. The film formation method of claim 6, wherein a second metal film made of a metal different from the first metal film is buried inside the recess, and
wherein the first metal film is a cap film that covers the second metal film.

8. The film formation method of claim 7, wherein the second metal film is a Cu film, and
wherein the cap film as the first metal film is a Co film or a Ru film.

9. The film formation method of claim 8, wherein the first insulating film is a SiN film, a SiO film, a SiOC film, a SiON film, or a SiOCN film.

10. The film formation method of claim 9, further comprising supplying the organic compound in a gaseous state to the surface of the substrate.

11. The film formation method of claim 3, wherein the substrate further includes, on the surface of the substrate, a fourth region from which a liner film is exposed, and
  wherein the film formation method further comprises:
    forming the self-assembled monolayer in the second region, the third region, and the fourth region by selectively adsorbing the organic compound to the second region, the third region, and the fourth region, among the first region, the second region, the third region, and the fourth region; and
    forming the second insulating film in the first region while formation of the second insulating film in the second region, the third region, and the fourth region is inhibited by the self-assembled monolayer.

12. The film formation method of claim 2, wherein a second metal film made of a metal different from the first metal film is buried inside the recess, and
  wherein the first metal film is a cap film that covers the second metal film.

13. The film formation method of claim 2, wherein the first metal film is a Cu film or a W film.

14. The film formation method of claim 2, wherein the first insulating film is a SiN film, a SiO film, a SiOC film, a SiON film, or a SiOCN film.

15. The film formation method of claim 1, further comprising supplying the organic compound in a gaseous state to the surface of the substrate.

* * * * *